United States Patent [19]
Cox

[11] 3,976,945
[45] Aug. 24, 1976

[54] FREQUENCY SYNTHESIZER
[75] Inventor: Roger G. Cox, Loveland, Colo.
[73] Assignee: Hewlett-Packard Company, Palo Alto, Calif.
[22] Filed: Sept. 5, 1975
[21] Appl. No.: 610,604

[52] U.S. Cl. .................................. 328/14; 328/48; 328/155
[51] Int. Cl.² ........................................ H03B 19/00
[58] Field of Search ................ 307/220; 328/14, 48, 328/155

[56] References Cited
UNITED STATES PATENTS

| | | |
|---|---|---|
| 3,464,018 | 8/1969 | Cliff .................................. 328/14 X |
| 3,689,914 | 9/1972 | Butler ............................... 328/14 X |
| 3,882,403 | 5/1975 | Gerken .................................. 328/14 |

Primary Examiner—John S. Heyman
Attorney, Agent, or Firm—William E. Hein

[57] ABSTRACT

A frequency synthesizer employs a reference oscillator, a cycle swallower, a modulo-N counter, a programmable delay generator, and an accumulator to generate pulses at a precise, selected frequency which is any rational fraction of the reference oscillator frequency. The period between pulses is kept constant by use of the programmable delay generator to substantially reduce cycle-to-cycle phase variations, and to thus assure an output signal of the selected frequency that has high spectral purity.

10 Claims, 3 Drawing Figures

FREQUENCY SYNTHESIZER

REFERENCE TO RELATED APPLICATION

This application is related to the subject matter of copending U.S. patent application Ser. No. 509,577 now U.S. Pat. No. 3,928,813 entitled FREQUENCY SYNTHESIZER, filed on Sept. 26, 1974, by Charles A. Kingsford-Smith, and assigned to the same assignee as the present application.

BACKGROUND AND SUMMARY OF THE INVENTION

This invention pertains generally to frequency synthesizers, and more particularly to a device for generating spectrally pure signals of selected frequencies that may be any arbitrary rational fraction of a reference frequency.

It is known in the art to generate frequencies by means of modulo-N counters, which may be set to produce one output pulse for a selected number of pulses of the reference frequency. Signals derived from these output pulses may have a high degree of spectral purity, since the time period between output pulses is relatively constant, but only frequencies that are exact subharmonics of the reference frequency may be generated by prior art devices employing this technique.

Frequencies other than subharmonics of the reference frequency have been generated by prior art frequency sources using rate multipliers, such as an SN 7497 integrated circuit package, which produces a programmed number of output pulses for a fixed number of input pulses. Rate multipliers produce output pulses at an average frequency which is any rational fraction of the reference frequency, but, since output pulses of a rate multiplier must coincide with the occurrence of an input pulse, the periods between successive output pulses may not be constant, and the resultant output signal will have poor spectral purity.

Other prior art precision frequency sources have employed, for example, phase-locked loops to control the selected output frequency. These prior art sources are disadvantageous in that extensive and complex analog circuitry is required.

Accordingly, it is an object of the present invention to provide a circuit for generating an output signal at a frequency that is any arbitrary fraction of a reference oscillator frequency. Further objects of this invention are to provide a means for producing output signals having high spectral purity by eliminating cycle-to-cycle variations in the occurrence of pulses of the output signal, and to provide such signals with a minimum of analog circuitry.

These objects are accomplished in accordance with the preferred embodiment of the invention by the use of a fixed reference oscillator, a cycle swallower, a modulo-N counter, a programmable delay generator, and an accumulator to produce output pulses spaced at intervals corresponding to a computed rational number of periods of the reference oscillator frequency. The combination of the modulo-N counter, the accumulator, and the cycle swallower allows selection of an output frequency which is any rational fraction of the reference oscillator frequency. The programmable delay generator, in conjunction with the accumulator, provides an interpolation function that equalizes the time between output pulses so that the fundamental component of the output signal of selected frequency has high spectral purity. This equalization is accomplished by delaying pulses from the modulo-N counter by a selected amount of time which is determined by the accumulator.

The selected frequency is synthesized by first calculating the ratio of the reference oscillator frequency to the selected output frequency. This calculated ratio is the period of the output frequency expressed as a number of periods of the reference oscillator frequency. The integer portion of this calculated ratio controls the modulo-N counter, which divides down the reference oscillator frequency to the subharmonic of the reference oscillator frequency nearest to the selected output frequency. The accumulator, which is a device that sums its existing contents with an incrementing number determined by the fractional portion of the aforementioned ratio calculation in response to a clocking signal, controls the length of the delay of a pulse from the modulo-N counter through the delay generator. A sum that exceeds the capacity of the accumulator generates a signal that activates the cycle swallower, thus inhibiting one pulse from the reference oscillator, so that frequencies other than exact subharmonics of the reference frequency may be generated.

DESCRIPTION OF THE PREFERRED EMBODIMENT

Figure 1:
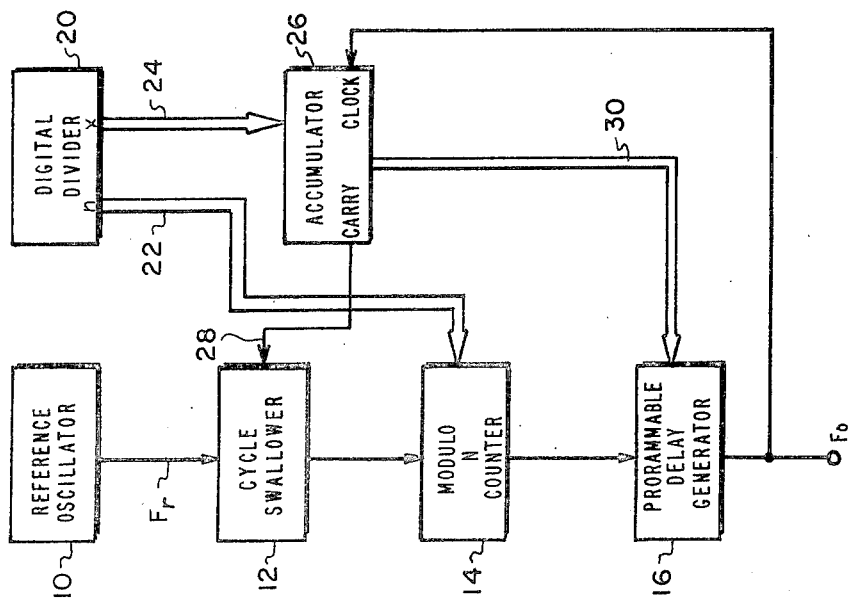
FIG. 1 is a block diagram of a frequency source employing a programmable delay generator to produce evenly-spaced output pulses.

Referring now to FIG. 1, there is shown a block diagram of a circuit for generating an output signal that has an output frequency $F_o$ that is any selected rational fraction of a fixed reference frequency $F_r$ produced by a reference oscillator 10. The output of the reference oscillator 10 is connected to a cycle swallower 12. The cycle swallower 12 prevents a pulse applied at its input from appearing at its output whenever a control line 28 is activated, and allows pulses applied at its input to appear at its output whenever the control line 28 is inactive. A cycle swallower that may be employed in the preferred embodiment of this invention is shown in the above-referenced U.S. patent application.

The output of the cycle swallower is applied to the input of a modulo-N counter 14 which produces one output pulse for each selected N pulses applied at its input. The output of the modulo-N counter 14 is applied to the input of a programmable delay generator 16. The programmable delay generator 16 is described in detail hereinbelow, but it is sufficient for understanding the operation of the preferred embodiment of the invention to know that it has the capability of delaying a pulse appearing at its input for up to one period of the reference frequency $F_r$. The amount of delay of the programmable delay generator is controlled by digital information produced by an accumulator 26, which is connected to the programmable delay generator 16 by a delay control bus 30.

A digital divider 20 computes the ratio of the reference frequency $F_r$ to the selected output frequency $F_o$ according to the format:

$$F_r/F_o = n.x,$$

where $n$ is the integer component of the computed ratio and $x$ is the fractional component of that ratio. The digital divider may employ any of a number of well-known techniques for performing a division operation and storing the integer and fractional components of the division result. For example, a microprocessor may be employed to perform the entire operation, or storage registers may be employed to merely receive the results of a division operation that may be performed by means external to the circuitry of FIGS. 1 and 2. The integer component $n$ of the ratio is supplied as an input to the modulo-N counter 14 by an integer data bus 22 to set the division factor of the modulo-N counter 14. The fractional component $x$ of the ratio is supplied as an input to the accumulator 26 by means of a fractional data bus 24 to serve as an incrementing number for the accumulator 26. Upon receiving a clocking signal, the accumulator sums its existing contents with the incrementing number to produce a new output number which controls the programmable delay generator 16 by means of the delay control bus 30. A carry signal is generated by the accumulator 26 during any clocked period in which the summed value exceeds the capacity of the accumulator. Less significant digits of the sum are retained by the accumulator 26 after such an overflow condition occurs. For simplicity, the capacity of the accumulator 26 may be arranged to be unity.

The output of the programmable delay generator 16 serves as the output signal of the frequency synthesizer and also serves as the clocking signal for the accumulator 26. The carry signal from the accumulator 26 is connected to the cycle swallower 12 via the control line 28 so that a pulse from the reference oscillator 10 will be prevented from appearing at the output of the cycle swallower 12 when a carry signal is generated by the accumulator 26.

The selected output frequency $F_o$ is generated in accordance with the illustrated preferred embodiment of this invention by generating pulses at time intervals computed as a rational number of periods of the reference frequency $F_r$. The modulo-N counter 14 and the cycle swallower 12 control the average output frequency of the synthesizer by dividing down the reference frequency $F_r$ to the selected lower frequency. The programmable delay generator 16 delays individual pulses by calculated amounts of time up to one period of the reference frequency $F_r$ to equalize the time between the individual pulses of the selected average output frequency.

The operation of the synthesizer circuit may be best understood by an illustrative example. Assume the reference frequency $F_r$ of the reference oscillator 10 is 10 Megahertz, and that the selected output frequency $F_o$ is 3 Megahertz. Assume further that the resolution of both the accumulator 26 and the programmable delay generator 16 is four digits and that the digital divider 20 computes numbers to four decimal places. The accumulator is initially cleared to zero.

The digital divider 20 first computes the ratio of the reference frequency $F_r$ to the selected output frequency $F_o$ to be 3.3333, meaning that a pulse of the output signal should occur at every 3.3333 periods of the reference frequency $F_r$. The integer component of the calculated ratio is applied via the integer data bus 22 to set the modulo-N counter 14 to divide by three. The fractional value 0.3333 is applied to the accumulator 26 by means of the fractional data bus 24 to serve as the incrementing value for the accumulator 26.

The first three pulses of the reference frequency $F_r$ from the reference oscillator 10 pass uninterrupted through the cycle swallower 12, since the carry signal on control line 28 from the accumulator 26 is inactive. Upon the occurrence of the third pulse of reference frequency $F_r$, a pulse occurs at the output of the modulo-N counter 14, and, since the value of the contents of the accumulator is zero, this pulse passes through the programmable delay generator 16 without any programmed delay, and appears as a pulse of the synthesizer output signal. This pulse of the output signal clocks the accumulator and updates the contents of the accumulator to 0.3333 by summing its existing contents (zero) with the incrementing value of 0.3333. The carry signal connected to control line 28 is still inactive, and thus three more pulses of the reference frequency $F_r$ pass through the cycle swallower 12 and cause a second pulse to occur at the output of the modulo-N counter 14. The value of the contents of the accumulator 26 causes this second pulse to be delayed by the programmable delay generator 16 for a period of time equal to 0.3333 of a cycle of the reference frequency $F_r$. This second output pulse clocks the accumulator 26 and updates its contents to 0.6666 by summing the existing contents of 0.3333 and the incrementing value of 0.3333.

Three more pulses of reference frequency $F_r$ cause a third pulse to occur at the output of the modulo-N counter 14, which pulse is then delayed by the programmable delay generator 16 for a period of time equal to 0.6666 of a cycle of the reference frequency $F_r$. Upon the occurrence of this fourth synthesizer output pulse the accumulator is again clocked. Since the sum of the existing accumulator contents of 0.9999 and the incrementing value of 0.3333 is greater than one, the sum exceeds the capacity of the accumulator 26. As a result, the carry signal from the accumulator is set to its active state and the contents of the accumulator becomes 0.3332. The carry signal from the accumulator 26 activates the cycle swallower 12, and the next pulse from the reference oscillator 10 is "swallowed" or prevented from appearing at the input of the modulo-N counter 14. After swallowing this one pulse, the cycle swallower becomes inactive, and three successive pulses of the reference frequency $F_r$, appearing at the input to the modulo-N counter 14, cause a fifth pulse to occur at the output of the modulo-N counter 14, which pulse is then delayed by the programmable delay generator 16 for a time period equal to 0.3332 of a cycle of the reference frequency $F_r$. The combination of the cycle swallower 12 and the modulo-N counter 14 has now prevented a pulse from occurring at the output of the modulo-N counter 14 until four pulses of the reference frequency $F_r$ have elapsed, in contrast to the normal three pulses elapsing due to the modulo-N counter 14 alone. The period between the fourth and fifth synthesizer output pulses is still 3.3333 periods of the reference frequency $F_r$, however, since activation of the pulse swallower is accompanied by a decrease in the delay time of the programmable delay generator 16 of 0.6667 of a period of the reference frequency $F_r$. The above-described pattern continues, and synthesizer output pulses continue to occur every 3.3333 periods of the reference frequency $F_r$. Those persons skilled in the art will appreciate that a modulo-N counter which alters its division factor by one upon receipt of a signal from the carry output of the accumulator 26 is a satisfactory substitute for the combination of the modulo-N counter 14 and cycle swallower 12 described herein.

It will be appreciated by those persons skilled in the art that truncation errors may result from the finite number of significant digits of the digital divider 20 and the accumulator 26. In the above-described example, for instance, truncation errors caused the programmable delay generator 16 to delay the fifth pulse only 0.3332 of a cycle, instead of the correct delay of 0.3333 of a cycle, of the reference frequency $F_r$. Such an error may appear to be negligible, but, as the accumulator continues to operate for many cycles of the selected output frequency $F_o$, this error can accumulate and result in errors in the output frequency $F_o$. For instance, it can be shown that the output frequency in the above-described example will be in error by 30 Hz from the selected output frequency of 3 Megahertz due to truncation errors. These errors can be reduced, but not eliminated, by increasing the number of significant digits of the digital divider 20 and the accumulator 26 to several digits more than what is supplied to the programmable delay generator 16. These extra digits cause truncation errors to accumulate much more slowly, and the resultant output frequency $F_o$ will consequently be closer to the selected output frequency.

Figure 2:
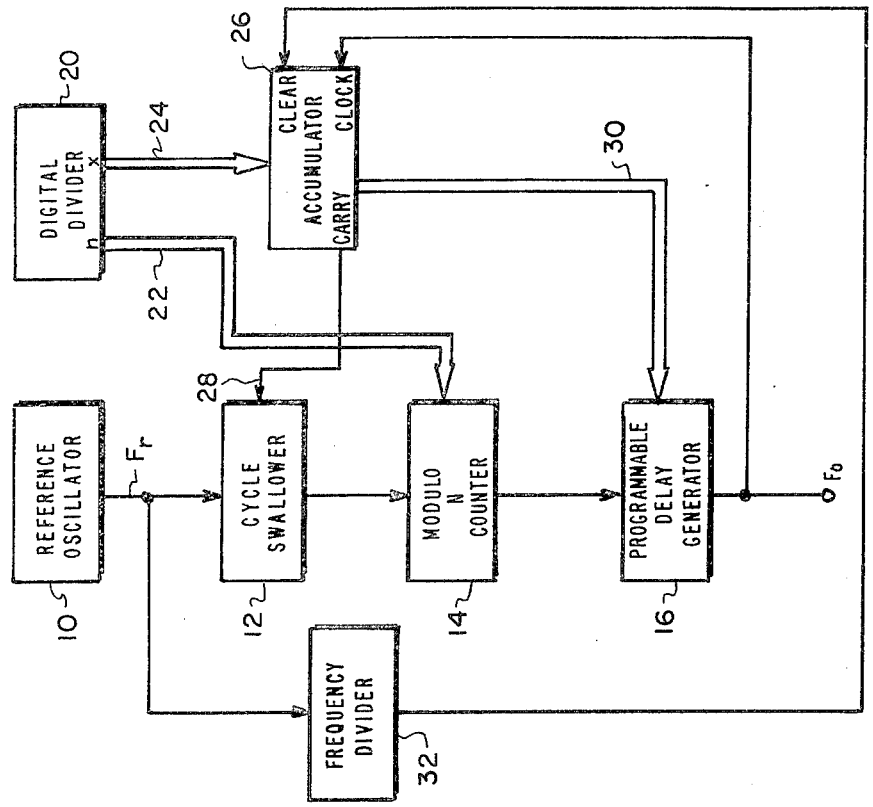
FIG. 2 is a block diagram of the frequency source of FIG. 1 with a fixed divider added to prevent error accumulation.

An alternative preferred embodiment which prevents truncation errors from accumulating is shown in FIG. 2. The block diagram in FIG. 2 is the same as that of FIG. 1, except that an additional fixed frequency divider 32 is connected between the output of the reference oscillator 10 and the clear input of the accumulator 26. The fixed frequency divider 32 clears the accumulator 26 at a rate determined by the designed basic resolution $F_b$ of the synthesizer. For example, if the synthesizer is designed to synthesize frequencies in increments as small as one Hertz, the frequency divider 32 should clear the accumulator once each second. The frequency divider 32 is thus arranged to divide down the reference frequency $F_r$ by the basic resolution $F_b$ to generate a signal to clear the accumulator at the proper rate. When the fixed divider 32 is connected to periodically clear the accumulator, the number of digits required in the digital divider 20 and the accumulator 26 to avoid propagation of an error into data supplied to the programmable delay generator 16 before clearing is a function of a maximum output frequency $F_{max}$ and the basic resolution $F_b$ of the synthesizer. The number of digits must be long enough so that the incrementing amount may be added in the accumulator $F_{max}/F_b$ times before the error is propagated into the digits applied to the programmable delay generator 16. By adhering to the above-described formulas for the division factor of the frequency divider 32 and the length of the digital divider 20 and accumulator 26, the accumulator will be cleared just prior to the point at which any truncation error would be propagated into the programmable delay generator 16.

Figure 3:
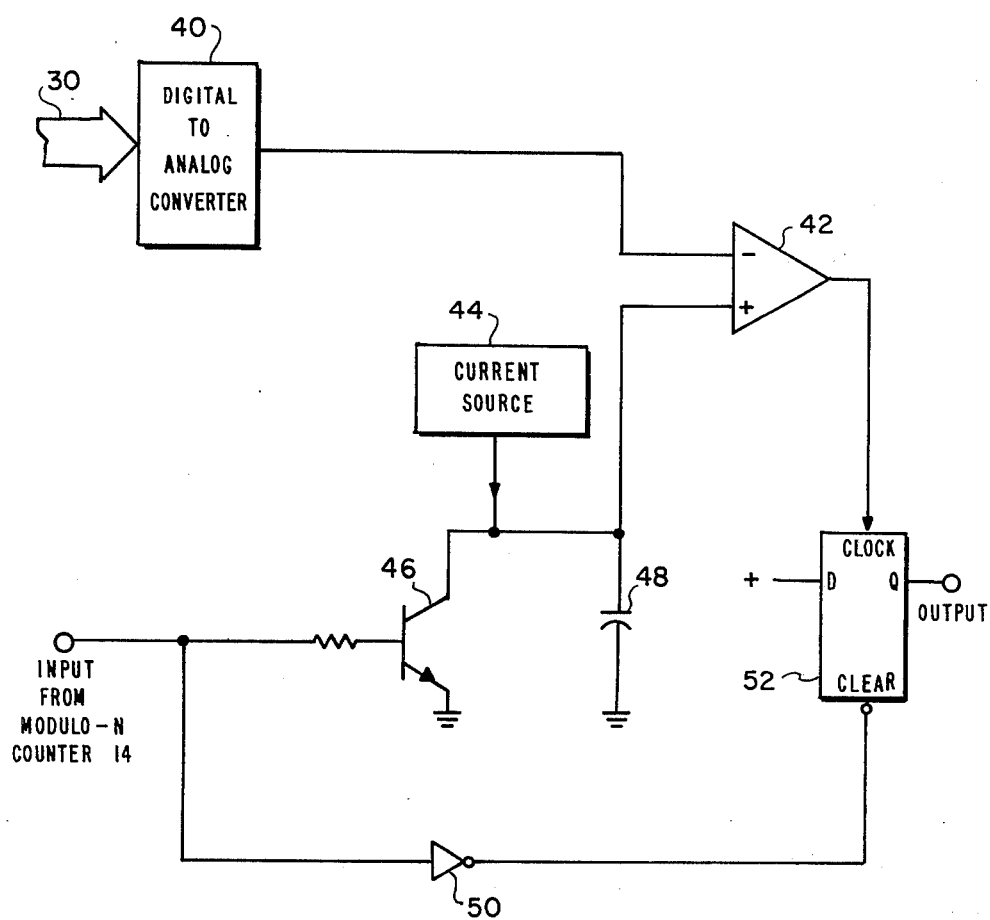
FIG. 3 is a schematic diagram of the programmable delay generator employed in the frequency source of FIGS. 1 and 2.

Referring now to FIG. 3, there is shown a detailed circuit diagram for the programmable delay generator 16 of FIGS. 1 and 2. A digital-to-analog converter 40 receives digital information from the delay control bus 30 and produces an analog voltage related to the value of the contents of the accumulator 26. This analog voltage is connected to one input of a comparator 42. The output of the modulo-N counter 14 is applied to the base of a transistor switch 46 and to an inverter 50. A current source 44, the collector of the transistor 46, and one lead of a capacitor 48 are connected to another input of the comparator 42. The emitter of the transistor 46 and the other lead of the capacitor 48 are connected to ground. The output of the comparator 42 is connected to the clock input of a D flip-flop 52. The output of the inverter 50 is connected to the clear input of the flip-flop 52, and the D input of flip-flop 52 is tied to a logical one.

In the absence of a pulse from the output of the modulo-N counter 14, the transistor 46 is on, thus preventing the current source 44 from charging the capacitor 48. At the same time the clear input to flip-flop 52 is activated, thus holding its Q output low. When a pulse occurs at the output of the modulo-N counter 14, the transistor 46 is turned off, and current source 44 then charges capacitor 48, which generates a linearly increasing voltage that is applied to the second input to the comparator 42. The pulse from the modulo-N counter 14 also inactivates the clear input to the flip-flop 52, and allows the flip-flop to respond to a pulse at its clock input. When the voltage across the capacitor 48 reaches the level of the voltage from the digital-to-analog converter 40, the output of the comparator 42 changes state and clocks flip-flop 52 to generate a pulse that serves as the output pulse of the synthesizer. The time interval between the receipt of a pulse from the output of the modulo-N counter 14 and the occurrence of a pulse at the output of the flip-flop 52 is a linear function of the voltage produced by the digital-to-analog converter 40. The circuit is designed so that a maximum voltage from the digital-to-analog converter 40 produces a delay equal to the period of one cycle of the reference frequency $F_r$.

The preferred embodiment of the invention described herein produces a series of evenly-spaced pulses at a selected frequency $F_o$. These pulses may be used to generate other waveforms by techniques well-known in the art. For example, a symmetrical square wave of one-half the frequency of the pulses may be generated by applying the pulses to a flip-flop configured to toggle upon being clocked by each pulse. A sine wave may be generated by passing such a symmetrical square wave through a low-pass filter to extract the fundamental spectral component of the waveform.

I claim:

1. A frequency synthesizer for generating an output signal having a selected output frequency that is any rational fraction of the frequency of a reference signal, the frequency synthesizer comprising:

reference signal means for generating a pulsed signal having a fixed reference frequency;

input means for entering into the frequency synthesizer the integer component and the fractional component of the ratio of the fixed reference frequency to the selected output frequency;

digital accumulating means coupled to the input means for receiving the fractional component of the ratio of the fixed reference frequency to the selected output frequency, and for periodically summing, in response to a pulse of the synthesizer output signal, the fractional component of that ratio and the result of any previous summations stored in said digital accumulating means, and for issuing a carry signal whenever the result of a periodic summation exceeds the storage capacity of said digital accumulating means;

counting means coupled to the reference signal means, the input means, and the digital accumulating means for receiving the integer component of the ratio of the fixed reference frequency to the selected output frequency, the carry signal from the digital accumulating means, and the signal from the reference signal means, and for producing a pulse after counting each N pulses from the reference signal means so long as no carry signal is issued, and for producing a pulse after counting each N+1 pulses from the reference signal means so long as a carry signal is issued, N being the integer component of the ratio of the fixed reference frequency to the selected output frequency;

programmable delay means coupled to the counting means and to the digital accumulating means for receiving pulses from the counting means, and for delaying said pulses by an amount determined by the contents of the digital accumulating means to produce said output signal; and clearing means for periodically resetting the stored contents of the digital accumulating means to zero.

2. A frequency synthesizer as in claim 1 wherein the counting means comprises:

cycle swallowing means responsive to the carry signal issued by the digital accumulating means for propagating pulses received from the reference signal means for so long as no carry signal is issued, and for preventing propagation of the first pulse received from the reference signal means after the carry signal is issued; and a modulo-N counter coupled to the cycle swallowing means and responsive to the integer component of the ratio of the fixed reference frequency to the selected output frequency for producing one output pulse in response to each N pulses received from the cycle swallowing means, N being the integer component of that ratio.

3. A frequency synthesizer as in claim 1 wherein the counting means comprises a single counter that operates in a modulo-N mode by producing one output pulse in response to N input pulses when the carry signal is absent, and that operates in a modulo-N+1 mode by producing one output pulse in response to N+1 input pulses when the carry signal is present, N being the integer component of the ratio of the fixed reference frequency to the selected output frequency.

4. A frequency synthesizer as in claim 1 wherein the input means comprises:

means for receiving the selected output frequency value;

digital dividing means for calculating the ratio of the fixed reference frequency to the selected output frequency;

means for storing the integer component of the ratio calculated by the digital dividing means; and means for storing the fractional component of the ratio calculated by the digital dividing means.

5. A precision frequency source for producing an output signal having evenly spaced pulses of a selected frequency, the precision frequency source comprising:

reference signal means for generating a pulsed signal having a fixed reference frequency;

input means for entering into the precision frequency source the integer component and the fractional component of the ratio of the fixed reference frequency to the selected output frequency;

digital accumulating means coupled to the input means for receiving the fractional component of the ratio of the fixed reference frequency to the selected output frequency, and for periodically summing, in response to a pulse of the precision frequency source output signal, the fractional component of that ratio and the result of any previous summations stored in said digital accumulating means, and for issuing a carry signal whenever the result of a periodic summation exceeds the storage capacity of said digital accumulating means;

counting means coupled to the reference signal means, the input means, and the digital accumulating means for receiving the integer component of the ratio of the fixed reference frequency to the selected output frequency, the carry signal from the digital accumulating means, and the signal from the reference signal means, and for producing a pulse after counting each N pulses from the reference signal means so long as no carry signal is issued, and for producing a pulse after counting each N+1 pulses from the reference signal means so long as a carry signal is issued, N being the integer component of the ratio of the fixed reference frequency to the selected output frequency; and programmable delay means coupled to the counting means and to the digital accumulating means for receiving pulses from the counting means, and for delaying said pulses by an amount determined by the contents of the digital accumulating means to produce said output signal.

6. A precision frequency source as in claim 5 wherein the counting means comprises:

cycle swallowing means responsive to the carry signal issued by the digital accumulating means for propagating pulses received from the reference signal means for so long as no carry signal is issued, and for preventing propagation of the first pulse received from the reference signal means after the carry signal is issued; and a modulo-N counter coupled to the cycle swallowing means and responsive to the integer component of the ratio of the fixed reference frequency to the selected output freqency for producing one output pulse in response to each N pulses received from the cycle swallowing means, N being the integer component of that ratio.

7. A precision frequency source as in claim 5 wherein the counting means comprises a single counter that operates in a modulo-N mode by producing one output pulse in response to N input pulses when the carry signal is absent, and that operates in a modulo-N+1 mode by producing one output pulse in response to N+1 input pulses when the carry signal is present, N being the integer component of the ratio of the fixed reference frequency to the selected output frequency.

8. A frequency synthesizer for producing an output signal having an average selected output frequency that is any rational fraction of the frequency of a reference signal, the frequency synthesizer comprising:

reference signal means for generating a pulsed signal having a fixed reference frequency;

input means for entering into the frequency synthesizer the integer component and the fractional component of the ratio of the fixed reference frequency to the selected output frequency;

digital accumulating means coupled to the input means for receiving the fractional component of the ratio of the fixed reference frequency to the selected output frequency, and for periodically summing, in response to a pulse of the frequency synthesizer output signal, the fractional component of that ratio and the result of any previous summations stored in said digital accumulating means, and for issuing a carry signal whenever the result of a periodic summation exceeds the storage capacity of said digital accumulating means;

counting means coupled to the reference signal means, the input means, and the digital accumulating means for receiving the integer component of the ratio of the fixed reference frequency to the selected output frequency, the carry signal from the digital accumulating means, and the signal from the reference signal means, and for producing a pulse after counting each N pulses from the reference signal means so long as no carry signal is issued, and for producing a pulse after counting each N+1 pulses from the reference signal means so long as a carry signal is issued, N being the integer component of the ratio of the fixed reference frequency to the selected output frequency; and clearing means for periodically resetting the stored contents of the digital accumulating means to zero.

9. A frequency synthesizer as in claim 8 wherein the counting means comprises:

cycle swallowing means responsive to the carry signal issued by the digital accumulating means for propagating pulses received from the reference signal means for so long as no carry signal is issued, and for preventing propagation of the first pulse received from the reference signal means after the carry signal is issued; and a modulo-N counter coupled to the cycle swallowing means and responsive to the integer component of the ratio of the fixed reference frequency to the selected output frequency for producing one output pulse in response to each N pulses received from the cycle swallowing means, N being the integer component of that ratio.

10. A frequency synthesizer as in claim 8 wherein the counting means comprises a single counter that operates in a modulo-N mode by producing one output pulse in response to N input pulses when the carry signal is absent, and that operates in a modulo-N+1 mode by producing one output pulse in response to N+1 input pulses when the carry signal is present, N being the integer component of the ratio of the fixed reference frequency to the selected output frequency.

* * * * *